(12) United States Patent
Jeong

(10) Patent No.: US 10,090,828 B2
(45) Date of Patent: Oct. 2, 2018

(54) DUTY-CYCLE CORRECTION CIRCUIT AND METHOD

(71) Applicant: SK hynix Inc., Gyeonggi-do (KR)

(72) Inventor: Yo-Han Jeong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/651,111

(22) Filed: Jul. 17, 2017

(65) Prior Publication Data

US 2018/0175844 A1 Jun. 21, 2018

(30) Foreign Application Priority Data

Dec. 21, 2016 (KR) .................... 10-2016-0175283

(51) Int. Cl.
*H03K 5/156* (2006.01)
*H03K 3/017* (2006.01)
*H03K 5/133* (2014.01)
*H03K 5/05* (2006.01)
*H03K 7/08* (2006.01)
*H03K 5/00* (2006.01)

(52) U.S. Cl.
CPC .......... *H03K 5/1565* (2013.01); *H03K 3/017* (2013.01); *H03K 5/05* (2013.01); *H03K 5/133* (2013.01); *H03K 7/08* (2013.01); *H03K 2005/00019* (2013.01)

(58) Field of Classification Search
CPC ......... H03K 5/1565; H03K 7/08; H03K 7/017
See application file for complete search history.

(56) References Cited

U.S. PATENT DOCUMENTS

| | | | | |
|---|---|---|---|---|
| 5,969,552 A | * | 10/1999 | Lee | ............... H03L 7/07 327/149 |
| 7,009,407 B2 | * | 3/2006 | Lin | ............... G01R 31/3016 324/601 |
| 7,009,433 B2 | * | 3/2006 | Zhang | ............... H03L 7/0805 327/158 |
| 7,224,199 B1 | * | 5/2007 | Kang | ............... H03K 5/131 327/175 |

(Continued)

FOREIGN PATENT DOCUMENTS

KR 101046722 7/2011
KR 1020120046885 5/2012

*Primary Examiner* — Thomas J Hiltunen
(74) *Attorney, Agent, or Firm* — IP & T Group LLP

(57) ABSTRACT

A duty-cycle correction circuit may include a delayed clock generation unit suitable for generating a plurality of delayed clocks by delaying a target clock by different delay values, an up/down signal generation unit suitable for selecting a delayed clock having a delay value corresponding to a first section of the target clock, and generating an up/down signal according to the lengths of a second section of the target clock and the first section of the selected delayed clock, a duty-cycle control code generation unit suitable for generating a duty-cycle control code in response to the up/down signal, a duty-cycle adjusting unit suitable for generating a duty-cycle correction clock by adjusting the duty-cycle of a source clock, and a control unit suitable for enabling the delayed clock generation unit during a duty-cycle correction period, and disabling the delayed clock generation unit during periods except for the duty-cycle correction period.

20 Claims, 11 Drawing Sheets

(56) References Cited

U.S. PATENT DOCUMENTS

| | | | | |
|---|---|---|---|---|
| 8,487,680 B1* | 7/2013 | Chung | ............... | H03K 5/1565 327/172 |
| 2011/0267124 A1* | 11/2011 | Kim | ................ | H03K 5/1565 327/175 |
| 2014/0002155 A1* | 1/2014 | Park | ................ | H03L 7/0802 327/158 |
| 2014/0002157 A1* | 1/2014 | Choi | ................ | H03K 3/017 327/175 |
| 2014/0203854 A1* | 7/2014 | Jung | ................ | H03L 7/0802 327/158 |
| 2014/0320187 A1* | 10/2014 | Inagawa | ............. | H03K 5/1565 327/172 |

* cited by examiner

DUTY-CYCLE CORRECTION CIRCUIT AND METHOD

CROSS-REFERENCE TO RELATED APPLICATIONS

The present application claims priority of Korean Patent Application No. 10-2016-0175283, filed on Dec. 21, 2016, which is incorporated herein by reference in its entirety.

BACKGROUND

1. Field

Exemplary embodiments of the present invention relate to a duty-cycle correction circuit and a duty-cycle correction method.

2. Description of the Related Art

The double data rate (DDR) technology has been developed to improve the bandwidth of a memory system by allowing the memory system to operate in synchronization with both the rising and falling edges of a clock signal. In a DDR, the duty-cycle of the clock signal is an important factor for maintaining a maximum timing margin.

When the duty-cycle of the clock signal is not exactly 50, an error corresponding to the offset from 50% may reduce the timing margin of the DDR memory system. Therefore, there exists a need for a circuit capable of compensating for a distortion of the duty-cycle due to a process, voltage or temperature (PVT) variation. Hence, a memory system may typically include a duty-cycle correction circuit for correcting the duty-cycle of the clock signal in the memory system. A conventional duty-cycle correction circuit requires a long time to correct a duty-cycle and consumes a large amount of current or power for duty-cycle correction.

SUMMARY

Various embodiments are directed to a duty-cycle correction circuit and a duty-cycle correction method that is capable of reducing a duty-cycle correction time and power consumption. The duty-cycle correction circuit can perform a duty-cycle correction operation using a target clock and a delayed clock only during a preset period.

In accordance with an embodiment of the present invention, a duty-cycle correction circuit includes: a delayed clock generation unit suitable for generating a plurality of delayed clocks by delaying a target clock by different delay values; an up/down signal generation unit suitable for selecting a delayed clock having a delay value corresponding to a first section of the target clock, from the plurality of delayed clocks, and generating an up/down signal according to a length of a second section of the target clock and a length of a first section of the selected delayed clock; a duty-cycle control code generation unit suitable for generating a duty-cycle control code in response to the up/down signal; a duty-cycle adjusting unit suitable for generating a duty-cycle correction clock by adjusting the duty-cycle of a source clock according to the duty-cycle control code; and a control unit suitable for enabling the delayed clock generation unit during a duty-cycle correction period, and disabling the delayed clock generation unit during periods except for the duty-cycle correction period.

In accordance with an embodiment of the present invention, a duty-cycle correction method includes: selecting one of a source clock and a duty-cycle correction clock as a target clock; generating a plurality of delayed clocks by delaying the target clock by different delay values; selecting a delayed clock having a delay value corresponding to a first section of the target clock, from the plurality of delayed clock; generating an up/down signal according to a length of a second section of the target clock and a length of a first section of the selected delayed clock; generating a duty-cycle control code in response to the up/down signal; and generating the duty-cycle correction clock by adjusting the duty-cycle of the source clock according to the duty-cycle control code.

DETAILED DESCRIPTION

Figure 1:
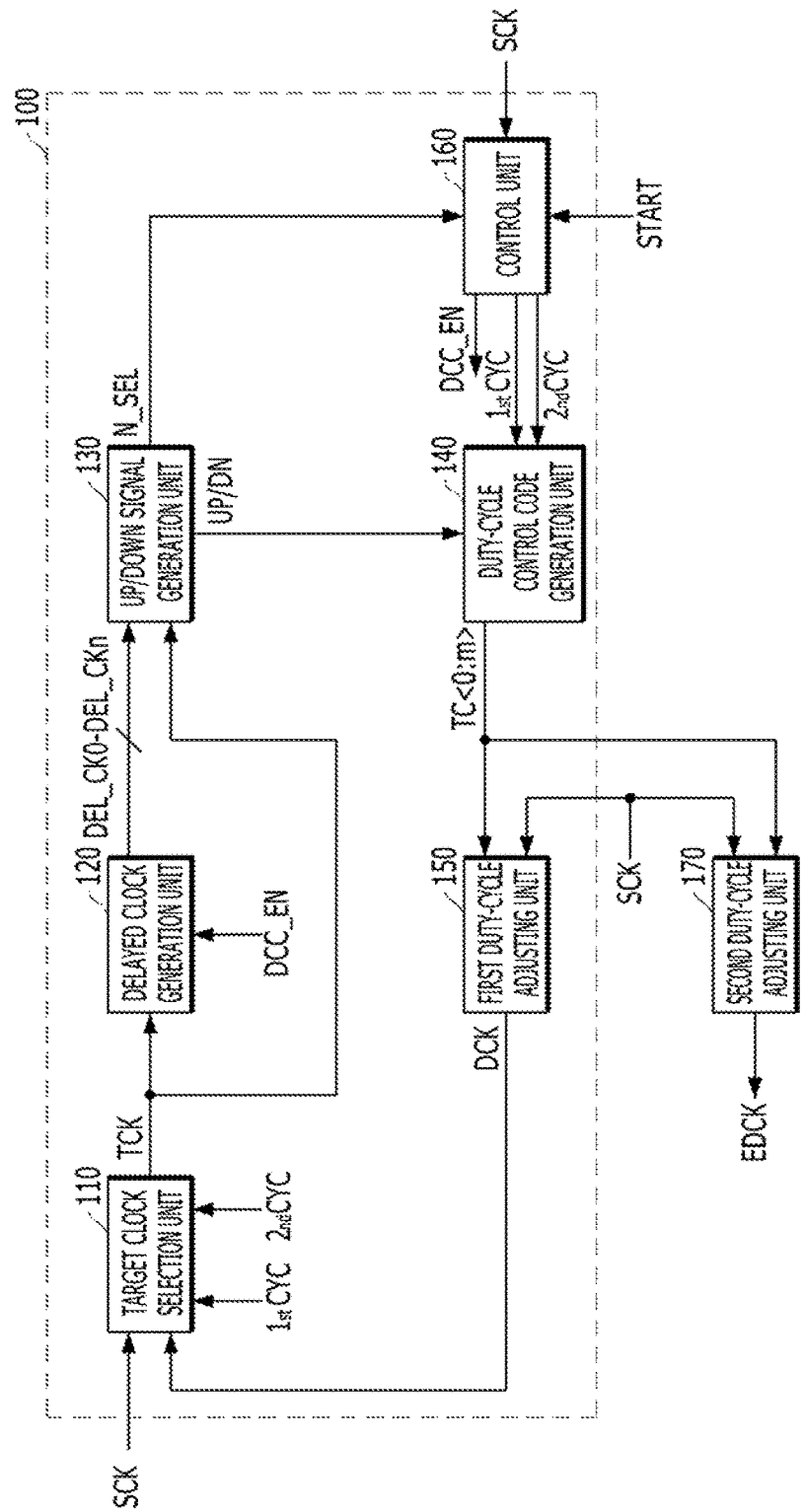
FIG. 1 is a block diagram illustrating a duty-cycle correction circuit, in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a duty-cycle correction circuit 100 in accordance with an embodiment of the present invention.

Referring to FIG. 1, the duty-cycle correction circuit 100 may include a target clock selection unit 110, a delayed clock generation unit 120, an up/down signal generation unit 130, a duty-cycle control code generation unit 140, a first duty-cycle adjusting unit 150 and a control unit 160. Outside the duty-cycle correction circuit 100, a second duty-cycle adjusting unit 170 may be provided. Hereafter, though a duty-cycle correction period may include two or more correction cycles, the case in which a duty-cycle correction period includes two correction cycles will be exemplified for description.

The target clock selection unit 110 may select one of a source clock SCK and a duty-cycle correction clock DCK to output a target clock TCK. The target clock selection unit 110 may select the source clock SCK as the target clock TCK at a first correction cycle among two or more correction cycles of the duty-cycle correction period, and select the duty-cycle correction clock DCK as the target clock TCK at any of the remaining correction cycles after the first correction cycle.

In the duty-cycle correction circuit 100 of FIG. 1, the duty-cycle correction period may include the first correction cycle and a second correction cycle. Therefore, the target clock selection unit 110 may select the source clock SCK as the target clock TCK at the first correction cycle in which a first cycle signal 1stCYC is activated, and select the duty-cycle correction clock DCK as the target clock TCK at the second correction cycle in which a second cycle signal 2ndCYC is activated.

The delayed clock generation unit 120 may generate a plurality of delayed clocks DEL_CK0 to DEL_CKn by delaying the target clock TCK by different delay values during the duty-cycle correction period in which a duty-cycle correction signal DCC_EN is activated, where n is a natural number. The plurality of delayed clocks DEL_CK0 to DEL_CKn may have different delay values from each other, and the delay values may be set to be increased from a first delayed clock DEL_CK0 to an (n+1)th delayed clocks DEL_CKn. That is, the phases of the delayed clocks DEL_CK0 to DEL_CKn may be delayed by the delay values which are increased from the first delayed clock DEL_CK0 to the (n+1)th delayed clock DEL_CKn. The delayed clock generation unit 120 may be disabled at periods, except for the duty-cycle correction period, in which the duty-cycle correction signal DCC_EN is deactivated, and deactivate all of the delayed clocks DEL_CK0 to DEL_CKn.

The up/down signal generation unit 130 may select a delayed clock having a delay value corresponding to a first section of the target clock TCK, from the plurality of delayed clocks DEL_CK0 to DEL_CKn, and generate an up/down signal UP/DN according to the length of a first section of the selected delayed clock and the length of a second section of the target clock TCK.

For reference, the first section may correspond to a high-level section of a clock signal, and the second section may correspond to a low-level section of the clock signal. Alternatively, the first section may correspond to a low-level section of a clock signal, and the second section may correspond to a high-level section of the clock signal. Hereafter, the former case will be exemplified for description. Furthermore, when the sum of the first and second sections corresponds to one cycle of the clock signal and the cycle of the clock signal is constantly maintained, the length of the first section and the length of the second section may be complementarily adjusted. That is, the length of the first section may be expressed as "one cycle of clock signal−length of second section", and the length of the second section may be expressed as "one cycle of clock signal−length of first section". Therefore, when the length of the first section is increased, the length of the second section may be decreased, and when the length of the first section is decreased, the length of the second section may be increased.

When the length of the second section (for example, low-level section) of the target clock TCK is shorter than the length of the first section (for example, high-level section) of the selected delayed clock, the up/down signal generation unit 130 may generate the up/down signal UP/DN to decrease the length of the first section of the duty-cycle correction clock DCK. Furthermore, when the length of the second section of the target clock TCK is longer than the length of the first section of the selected delayed clock, the up/down signal generation unit 130 may generate the up/down signal UP/DN to increase the length of the first section of the duty-cycle correction clock DCK. The up/down signal generation unit 130 may activate an unselect signal N_SEL when no delayed clock is selected from the plurality of delayed clocks DEL_CK0 to DEL_CKn.

For reference, depending on design, the length of the first section of the duty-cycle correction clock DCK may be decreased when the up/down signal UP/DN is at a high level, and increased when the up/down signal UP/DN is at a low level. Alternatively, the length of the first section of the duty-cycle correction clock DCK may be increased when the up/down signal UP/DN is at a high level, and decreased when the up/down signal UP/DN is at a low level. Hereafter, the former case will be exemplified for description.

The duty-cycle control code generation unit 140 may generate a duty-cycle control code TC<0:m> in response to the up/down signal UP/DN, where m is a natural number. At this time, the duty-cycle control code TC<0:m> may include a plurality of bits TC<0> to TC<m>, and the number of bits TC<0> to TC<m> may be equal to the number of correction cycles included in the duty-cycle correction period. At this time, the plurality of bits TC<0> to TC<m> may correspond to first to (m+1)th correction cycles.

The duty-cycle control code generation unit 140 may decide the values of the plurality of bits TC<0> to TC<m> in response to the up/down signals UP/DN generated at different correction cycles. The duty-cycle control code generation unit 140 may decide the values of the respective bits TC<0> to TC<m> in response to the up/down signals UP/DN generated at the corresponding correction cycles. For example, the duty-cycle control code generation unit 140 may decide the value of the first bit TC<0> in response to the up/down signal UP/DN generated at the first correction cycle, and decide the value of the second bit TC<1> in response to the up/down signal UP/DN generated at the second correction cycle.

For example, the duty-cycle control code generation unit 140 may set the value of the first bit TC<0> to a high level when the up/down signal UP/DN is at a high level at the first correction cycle or set the value of the first bit TC<0> to a low level when the up/down signal UP/DN is at a low level, and store the first bit TC<0>. Furthermore, the duty-cycle control code generation unit 140 may set the value of the second bit TC<1> to a high level when the up/down signal UP/DN is at a high level at the second correction cycle or set the value of the second bit TC<1> to a low level when the up/down signal UP/DN is at a low level, and store the second bit TC<1>.

The duty-cycle control code generation unit 140 may output the stored duty-cycle control code TC<0:1> corresponding to the first and correction cycles, respectively.

The first duty-cycle adjusting unit 150 may generate the duty-cycle correction clock DCK by adjusting the duty-cycle of the source clock SCK according to the duty-cycle control code TC<0:1>. The first duty-cycle adjusting unit 150 may generate the duty-cycle correction clock DCK by performing pull-up driving and pull-down driving using pull-up drivability and pull-down drivability which are decided according to the duty-cycle control code TC<0:1>. The first duty-cycle adjusting unit 150 may adjust the duty-cycle of the duty-cycle correction clock DCK by increasing the pull-down drivability when the first and second bits TC<0> and TC<1> are at a high level or increasing the pull-up drivability when the first and second bits TC<0> and TC<1> are at a low level.

For reference, as the pull-down drivability increases, the length of the high-level section may be decreased while the length of the low-level section is increased, and as the pull-up drivability increases, the length of the high-level section may be increased while the length of the low-level section is decreased.

In the above-described example, the first duty-cycle adjusting unit 150 may increase the low-level section of the duty-cycle correction clock DCK (or decrease the high-level section of the duty-cycle correction clock DCK) when the value of the first or second bit TC<0> or TC<1> is at a high level, and increase the high-level section of the duty-cycle correction clock DCK (or decrease the low-level section of the duty-cycle correction clock DCK) when the value of the first or second bit TC<0> or TC<1> is at a low level. At this time, the pull-up or pull-down drivability which is adjusted in response to the first bit TC<0> and the pull-up or pull-down drivability which is adjusted in response to the second bit TC<1> may be equal to each other or different from each other.

The control unit 160 may enable the delayed clock generation unit 120 during the duty-cycle correction period, and disable the delayed clock generation unit 120 during periods except for the duty-cycle correction period. The control unit 160 may generate the duty-cycle correction signal DCC_EN for setting the duty-cycle correction period, the first cycle signal 1stCYC for setting the first correction cycle, and the second cycle signal 2ndCYC for setting the second correction cycle, based on a result obtained by counting the source clock SCK. The control unit 160 may activate the duty-cycle correction signal DCC_EN, the first cycle signal 1stCYC and the second cycle signal 2ndCYC at preset periods, respectively. When the unselect signal N_SEL is activated, the control unit 160 may deactivate all of the duty-cycle correction signal DCC_EN, the first cycle signal 1stCYC and the second cycle signal 2ndCYC. The control unit 160 may enter the duty-cycle correction period when a start signal START is activated.

For reference, the first and second correction cycles may be included in the duty-cycle correction period, but not overlap each other. The control unit 160 may activate the first and second cycle signals 1stCYC and 2ndCYC such that the active periods of the first and second cycle signals 1stCYC and 2ndCYC are included in the active period of the duty-cycle correction signal DCC_EN, while the active periods of the first and second cycle signals 1stCYC and 2ndCYC do not over each other.

The second duty-cycle adjusting unit 170 may have the same configuration as the first duty-cycle adjusting unit 150, and generate an external duty-cycle correction clock EDCK by performing the same operation as the first duty-cycle adjusting unit 150. The second duty-cycle adjusting unit 170 may generate the external duty-cycle correction clock EDCK by adjusting the duty-cycle of the source clock SCK according to the duty-cycle control code TC<0:1> generated by the duty-cycle control code generation unit 140. The duty-cycle correction clock DCK may indicate a clock signal which is used for a duty-cycle correction operation in the duty-cycle correction circuit 100, and the external duty-cycle correction clock EDCK may indicate a clock signal which is used by a semiconductor device including the duty-cycle correction circuit 100, outside the duty-cycle correction circuit 100.

Figure 2:
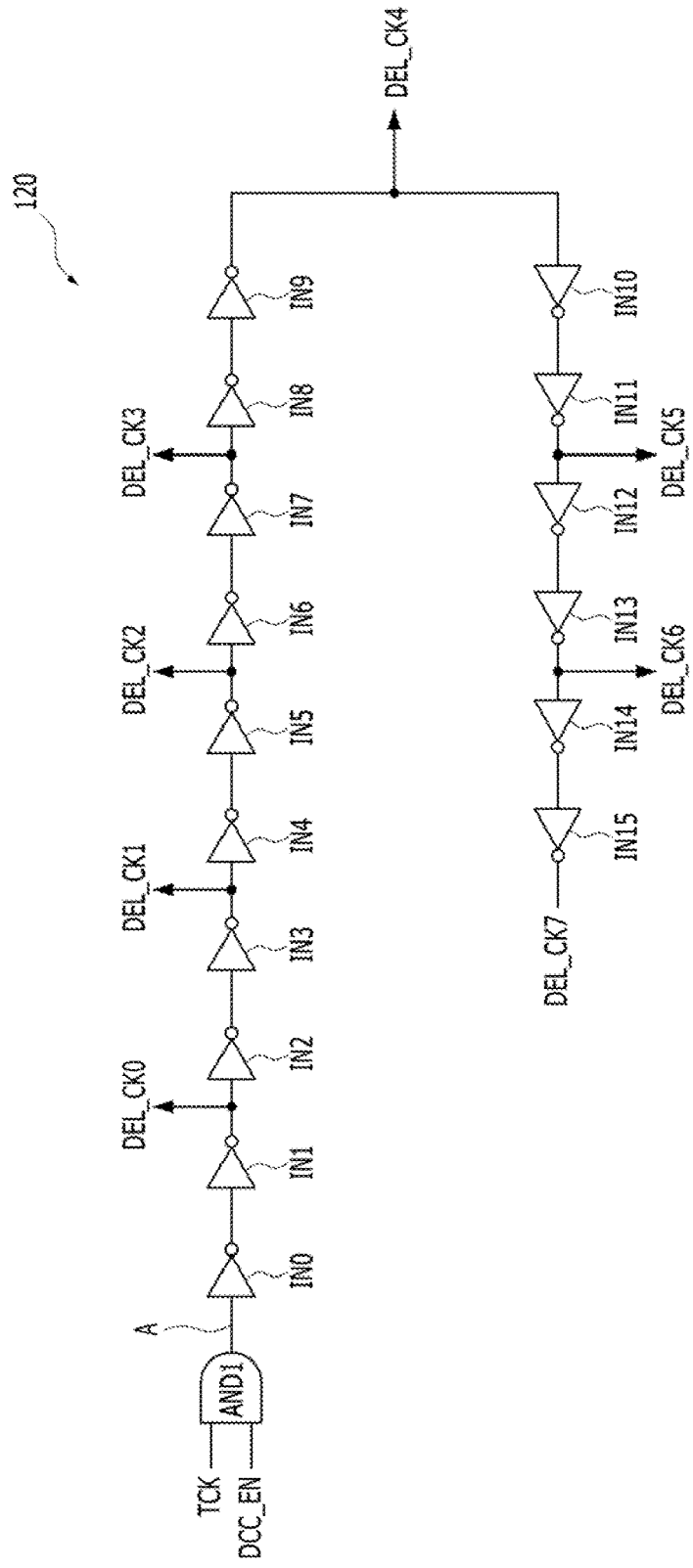
FIG. 2 is a circuit diagram illustrating an exemplary configuration of a delayed clock generation unit shown in FIG. 1.

FIG. 2 is a circuit diagram illustrating the delayed clock generation unit 120 shown in FIG. 1.

Referring to FIG. 2, the delayed clock generation unit 120 may include an AND gate AND1 and a plurality of inverters IN0 to IN15. The number of delayed clocks generated by the delayed clock generation unit 120 and the number of inverters included in the delayed clock generation unit 120 may be determined depending on design. Hereafter, the case in which the delayed clock generation unit 120 generates eight delayed clocks DEL_CK0 to DEL_CK7 and includes 16 inverters will be exemplified for description.

The AND gate AND1 may perform an AND operation on the duty-cycle correction signal DCC_EN and the target clock TCK. The AND gate AND1 may output the target clock TCK as an output A when the duty-cycle correction signal DCC_EN is activated to a high level, and block the target clock TCK and deactivate the output A to a low level when the duty-cycle correction signal DCC_EN is deactivated to a low level.

The plurality of inverters IN0 to IN15 may generate the plurality of delayed clocks DEL_CK0 to DEL_CK7 by delaying the output A of the AND gate AND1. Each of the plurality of delayed clocks DEL_CK0 to DEL_CK7 may be outputted from a corresponding output of even-numbered inverters, e. g., from outputs of second, fourth, sixth, eighth, tenth, twelfth and sixth inverters IN1, IN3, IN5, IN7, IN9, IN11, IN13 and IN15.

Figure 3A:
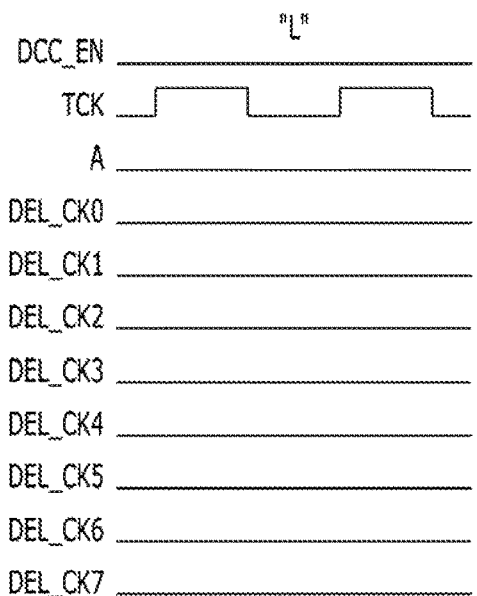
FIGS. 3A and 3B are waveform diagrams describing operations of the delayed clock generation unit shown in FIG. 2.
Figure 3B:
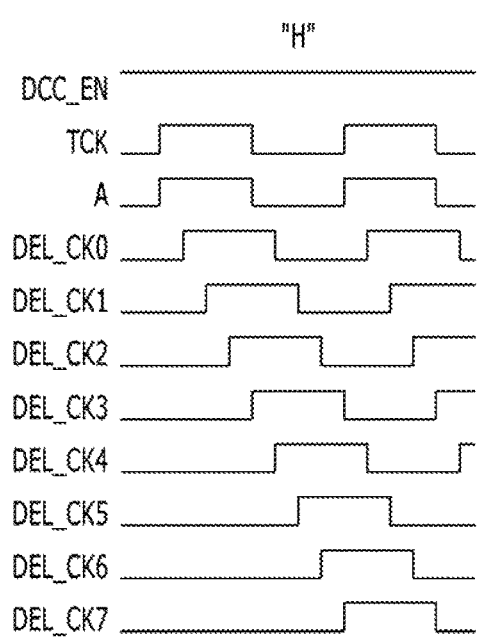

FIGS. 3A and 3B are waveform diagrams describing operations of the delayed clock generation unit 120 shown in FIG. 2.

FIG. 3A is a first waveform diagram showing the output A and the plurality of delayed clocks DEL_CK0 to DEL_CK7 when the duty-cycle correction signal DCC_EN is deactivated ("L"), and FIG. 3B is a second waveform diagram showing the output A and the plurality of delayed clocks DEL_CK0 to DEL_CK7 when the duty-cycle correction signal DCC_EN is activated ("H").

Referring to the first waveform diagram of FIG. 3A, when the duty-cycle correction signal ECC_EN is deactivated, the output A and the plurality of delayed clocks DEL_CK0 to DEL_CK7 may be all deactivated. Referring to the second waveform diagram of FIG. 3B, when the duty-cycle correction signal DCC_EN is activated, the output A may have the same waveform diagram as the target clock TCK, and the plurality of delayed clocks DEL_CK0 to DEL_CK7 may have phases delayed by delay values which are set to be increased from the first delayed clock DEL_CK0 to the eighth delayed clock DEL_CK7.

Figure 4:
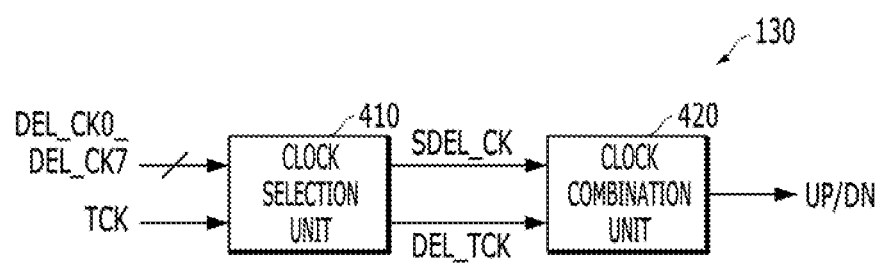
FIG. 4 is a block diagram illustrating an exemplary configuration of an up/down signal generation unit shown in FIG. 1.

FIG. 4 is a block diagram illustrating an exemplary configuration of the up/down signal generation unit 130 shown in FIG. 1.

Referring to FIG. 4, the up/down signal generation unit 130 may include a clock selection unit 410 and a clock combination unit 420.

The clock selection unit 410 may select a delayed clock having a delay value corresponding to the first section (high-level section) of the target clock TCK, from the plurality of delayed clocks DEL_CK0 to DEL_CK7, and generate a delayed target clock DEL_TCK by delaying the target clock TCK. That is, the clock selection unit 410 may select a delayed clock which is delayed by the high-level section of the target clock TCK, from the plurality of delayed clocks DEL_CK0 to DEL_CK7, and output a selected delayed clock SDEL_CK. Furthermore, the clock selection unit 410 may generate the delayed target clock DEL_TCK by delaying the target clock TCK by a time required for performing an operation of selecting one delayed clock from the plurality of delayed clocks DEL_CK0 to DEL_CK7.

The clock combination unit 420 may generate the up/down signal UP/DN according to the delayed target clock DEL_TCK and the selected delayed clock SDEL_CK selected by the clock selection unit 410. The clock combination unit 420 may include an AND gate (now shown) for performing an AND operation on the delayed target clock DEL_TCK and the selected delayed clock SDEL_CK. The clock combination unit 420 may include one of various circuits capable of performing an AND operation on the selected delayed clock SDEL_CK and the delayed target clock DEL_TCK, depending on design.

Figure 5:
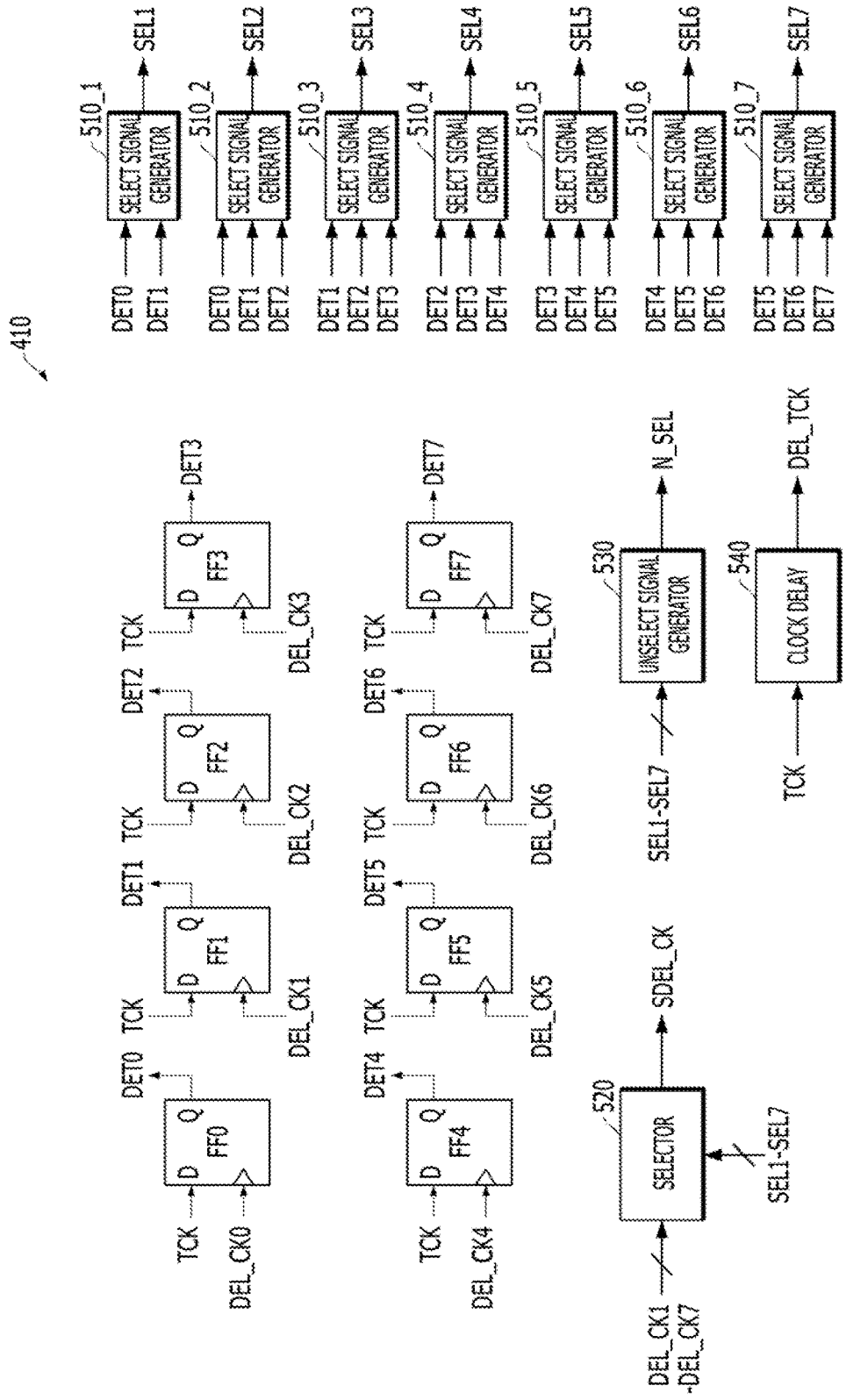
FIG. 5 is a block diagram illustrating an exemplary configuration of a clock selection unit shown in FIG. 4.

FIG. 5 is a block diagram illustrating an exemplary configuration of the clock selection unit 410 shown in FIG. 4.

Referring to FIG. 5, the clock selection unit 410 may include a plurality of flip flops FF0 to FF7, a plurality of select signal generators 510_1 to 510_7, a selector 520, an unselect signal generator 530 and a clock delay 540.

The clock selection unit 410 may detect the logic values of the target clock TCK at preset edges (for example, rising edges) of the plurality of delayed clocks DEL_CK0 to DEL_CK7, and select a delayed clock having a value corresponding to a combination of part or all of detected logic values DET0 to DET7, from the plurality of delayed clocks DEL_CK0 to DEL_CK7.

The plurality of flip flops FF0 to FF7 may detect the logic values of the target clock TCK at rising edges of the corresponding delayed clocks DEL_CK0 to DEL_CK7, and output the detected logic values DET0 to DET7. For example, when the logic value of the target clock TCK is at a high level at a rising edge of the delayed clock DEL_CK0, the flip flop FF0 may latch and output the logic value of the high level as the detected logic value DET0. On the other hand, when the logic value of the target clock TCK is at a low level at the rising edge of the delayed clock DEL_CK0, the flip flop FF0 may latch and output the logic value of the low level as the detected logic value DET0. For reference, the plurality of flip flops FF0 to FF7 may include D-flip flops.

The select signal generators 510_1 to 510_7 may generate select signals SEL1 to SEL7 by combining two or more logic values of the detected logic values DET0 to DET7. The select signal generator 510_1 may combine the detected logic values DET0 and DET1, and activate the select signal SEL1 in the case where the detected logic value DET0 is a high level and the detected logic value DET1 is a low level, or deactivate the select signal SEL1 in the other cases. The select signal generator 510_2 may combine the detected logic values DET0, DET1 and DET2, and activate the select signal SEL2 in the case where the detected logic value DET0 is a high level, the detected logic value DET1 is a high level, and the detected logic value DET2 is a low level, or deactivate the select signal SEL2 in the other cases. The select signal generator 510_k may combine the detected logic values DETk-2, DETk-1 and DETk, and activate the select signal SELk in the case where the detected logic value DETk-2 is a high level, the detected logic value DETk-1 is a high level and the detected logic value DETk is a low level, or deactivate the select signal SELk in the other cases, wherein k is an integer between 1 and 7.

The selector 520 may select a delayed clock from the plurality of delayed clocks DEL_CK1 to DEL_CK7 in response to the select signals SEL1 to SEL7, and output the selected delayed clock SDEL_CK. The selector 520 may select the delayed clock DEL_CK1 to output the selected delayed clock SDEL_CK when the select signal SEL1 is activated, select the delayed clock DEL_CK2 to output the selected delayed clock SDEL_CK when the select signal SEL2 is activated, select the delayed clock DEL_CK3 to output the selected delayed clock SDEL_CK when the select signal SEL3 is activated, select the delayed clock DEL_CK4 to output the selected delayed clock SDEL_CK when the select signal SEL4 is activated, select the delayed clock DEL_CK5 to output the selected delayed clock SDEL_CK when the select signal SEL5 is activated, select the delayed clock DEL_CK6 to output the selected delayed clock SDEL_CK when the select signal SEL6 is activated, and select the delayed clock DEL_CK7 to output the selected delayed clock SDEL_CK when the select signal SEL7 is activated.

The unselect signal generator 530 may generate the unselect signal N_SEL. The unselect signal generator 530 may deactivate the unselect signal N_SEL when one or more select signals among the select signals SEL1 to SEL7 are activated, and activate the unselect signal N_SEL when all of the select signals SEL1 to SEL7 are deactivated.

The clock delay 540 may receive the target clock TCK, and generate the delayed target clock DEL_TCK by delaying the target clock TCK by a time required for performing the operation of selecting one delayed clock from the plurality of delayed clocks DEL_CK0 to DEL_CK7 by the clock selection unit 410.

Figure 6A:
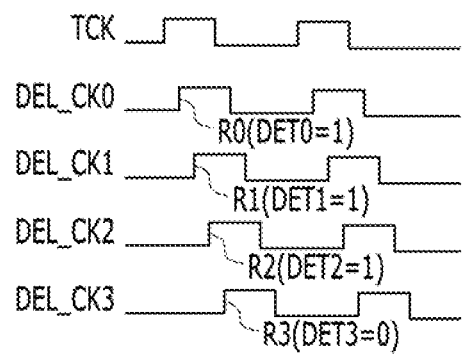
FIGS. 6A to 6C are waveform diagrams describing operations of the clock selection unit shown in FIG. 5.
Figure 6B:
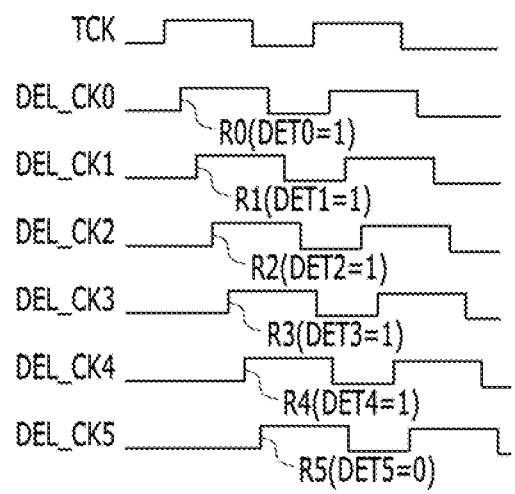
Figure 6C:
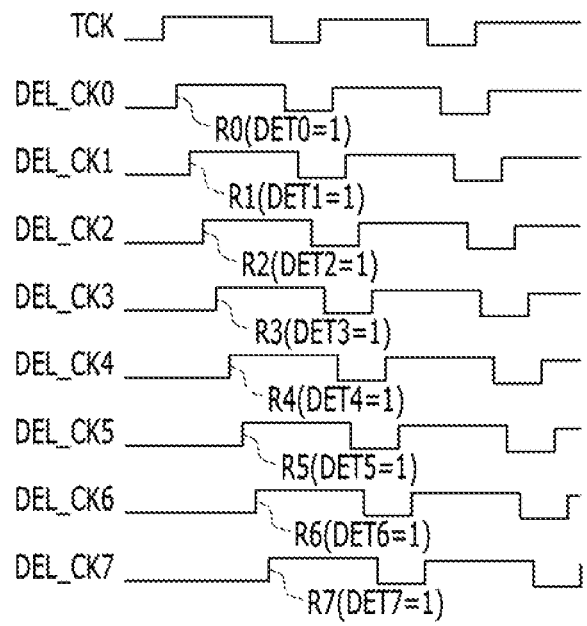

FIGS. 6A to 6C are waveform diagrams describing operations of the clock selection unit 410 shown in FIG. 5.

FIGS. 6A to 6C show a method for selecting one delayed clock from the plurality of delayed clocks DEL_CK1 to DEL_CK7 according to the detected logic values DET0 to DET7 of the target clock TCK, which are detected at the rising edges R0 to R7 of the respective delayed clocks DEL_CK0 to DEL_CK7.

FIG. 6A represents a first example in which the delayed clock DEL_CK3 is selected.

Referring to FIG. 6A, the detected logic values DET0 to DET3 of the target clock TCK, which are detected at the rising edges R0 to R3 of the respective delayed clocks DEL_CK0 to DEL_CK3, are 1, 1, 1 and 0, respectively. Since the detected logic value for each of the DET1 and DET2 is a high level, and the detected logic value for DET3 is a low level, the select signal SEL3 may be activated.

FIG. 6B represents a second example in which the delayed clock DEL_CK5 is selected.

Referring to FIG. 6B, the detected logic values DET0 to DET5 of the target clock TCK, which are detected at the rising edges R0 to R5 of the respective delayed clocks DEL_CK0 to DEL_CK5, are 1, 1, 1, 1, 1 and 0, respectively. Since the detected logic value DET3 is a high level, the detected logic value DET4 is a high level, and the detected logic value DET5 is a low level, the select signal SEL5 may be activated.

FIG. 6C represents a third example in which no delayed clock among the plurality of delayed clocks DEL_CK0 to DEL_CK7 is selected.

Referring to FIG. 6C, the detected logic values DET0 to DET7 of the target clock TCK, which are detected at the rising edges R0 to R7 of the respective delayed clocks DEL_CK0 to DEL_CK7, are 1, 1, 1, 1, 1, 1, 1 and 1, respectively. In this case, since the detected logic values do not satisfy the condition for activating the select signals, all of the select signals may be deactivated, and the unselect signal N_SEL may be activated.

As Illustrated in FIGS. 6A to 6C, a falling edge of the target clock TCK is present between the rising edges at which the detected logic values DET0 to DET7 are changed from 1 to 0. Therefore, the delay values of the delayed clocks having the rising edges at which the detected logic values DET0 to DET7 are changed from 1 to 0 may correspond to a high-level section of the target clock TCK.

Figure 7A:
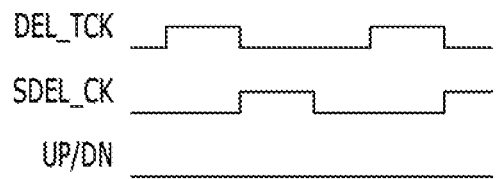
FIGS. 7A and 7B are waveform diagrams describing operations of a clock combination unit shown in FIG. 4.
Figure 7B:
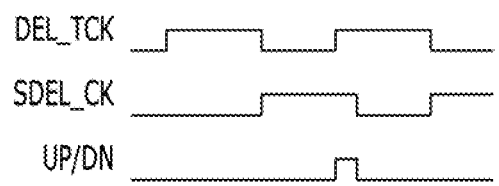

FIGS. 7A and 7B are waveform diagrams describing operations of the clock combination unit 420 shown in FIG. 4.

Referring to FIGS. 7A and 7B, the clock combination unit 420 may generate the up/down signal UP/DN by performing an AND operation on the selected delayed clock SDEL_CK and the delayed target clock DET_TCK.

FIG. 7A illustrates the selected delayed clock SDEL_CK, the delayed target clock DEL_TCK and the up/down signal UP/DN, when the first section (for example, high-level section) of the target clock TCK is shorter than the second section (for example, low-level section). The selected delayed clock SDEL_CK and the delayed target clock DEL_TCK may have different phases from the target clock TCK, but the first and second sections of the selected delayed clock SDEL_CK and the delayed target clock DEL_TCK may have the same lengths as those of the target clock TCK. Therefore, since the length of the first section of the selected delayed clock SDEL_CK is shorter than the length of the second section of the delayed target clock DEL_TCK, the up/down signal UP/DN may maintain a low level by the AND operation on the selected delayed clock SDEL_CK and the delayed target clock DEL_TCK.

FIG. 7B illustrates the selected delayed clock SDEL_CK, the delayed target clock DEL_TCK and the up/down signal UP/DN, when the first section (for example, high-level section) of the target clock TCK is longer than the second section (for example, low-level section). The selected delayed clock SDEL_CK and the delayed target clock DEL_TCK may have different phases from the target clock TCK, but the first and second sections of the selected delayed clock SDEL_CK and the delayed target clock DEL_TCK may have the same lengths as those of the target clock TCK. Therefore, since the length of the first section of the selected delayed clock SDEL_CK is longer than the length of the second section of the delayed target clock DEL_TCK, the up/down signal UP/DN may become a high level during a period in which the first section of the delayed target clock DEL_TCK and the first section of the selected delayed clock SDEL_CK overlap each other, by the AND operation on the selected delayed clock SDEL_CK and the delayed target clock DEL_TCK.

Figure 8:
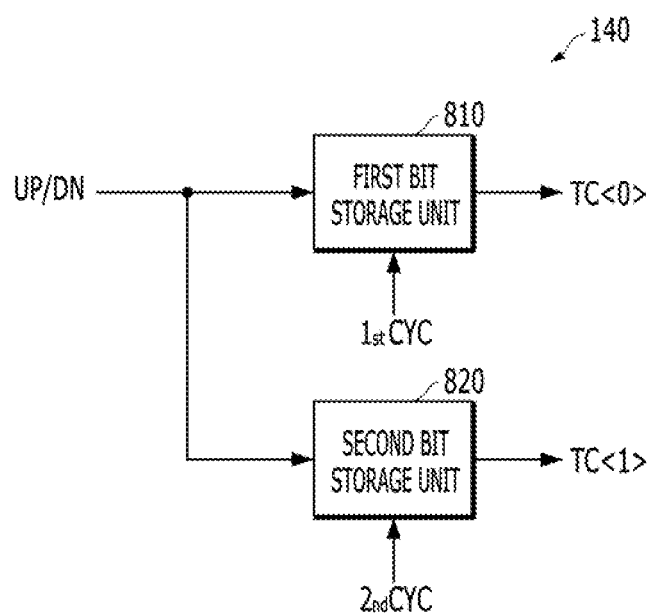
FIG. 8 is a block diagram illustrating an exemplary configuration of a duty-cycle control code generation unit shown in FIG. 1.

FIG. 8 is a block diagram illustrating an exemplary configuration of the duty-cycle control code generation unit 140 shown in FIG. 1.

Referring to FIG. 8, the duty-cycle control code generation unit 140 may include a first bit storage unit 810 and a second bit storage unit 820.

The first bit storage unit 810 may store the up/down signal UP/DN when the first cycle signal 1stCYC is activated, and output the first bit TC<0>. The second bit storage unit 820 may store the up/down signal UP/DN when the second cycle signal 2ndCYC is activated, and output the second bit TC<1>.

Figure 9:
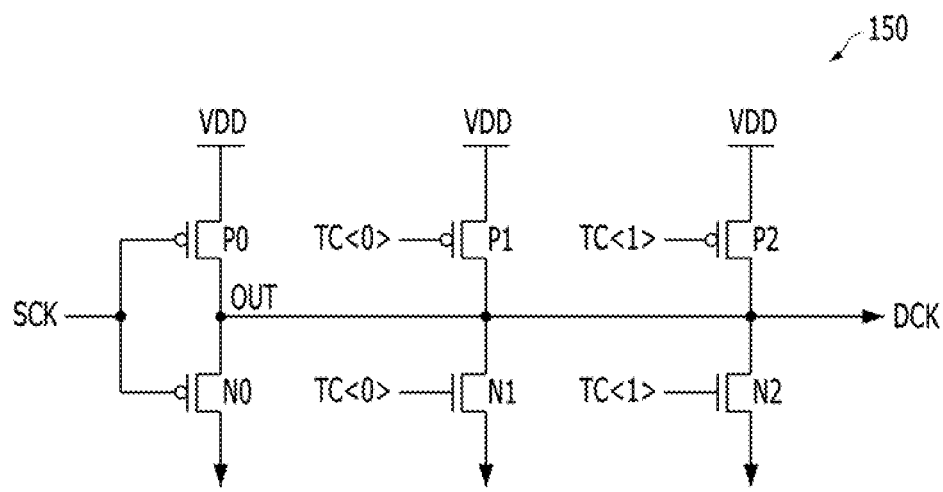
FIG. 9 is a circuit diagram illustrating a first duty-cycle adjusting unit shown in FIG. 1.

FIG. 9 is a circuit diagram illustrating the first duty-cycle adjusting unit 150 shown in FIG. 1.

Referring to FIG. 9, the first duty-cycle adjusting unit 150 may include a plurality of transistors N0 to N2 and P0 to P2.

The transistors N0 and P0 may drive an output node OUT in response to the source clock SCK. The duty-cycle correction clock DCK may be generated from the output node OUT. When the source clock SCK is at a low level, the transistor P0 may pull-up drive the output node OUT, and when the source clock SCK is at a high level, the transistor N0 may pull-down drive the output node OUT.

The transistors N1 and P1 may respectively pull-up drive or pull-down drive the output node OUT in response to the first bit TC<0> of the duty-cycle control code TC<0: 1>. When the first bit TC<0> is at a low level, the transistor N1 may be turned off, and the transistor P1 may be turned on to pull-up drive the output node OUT. When the first bit TC<0> is at a high level, the transistor P1 may be turned off, and the transistor N1 may be turned on to pull-down drive the output node OUT.

The transistors N2 and P2 may respectively pull-up drive or pull-down drive the output node OUT in response to the second bit TC<1> of the duty-cycle control code TC<0:1>. When the second bit TC<1> is at a low level, the transistor N2 may be turned off, and the transistor P2 may be turned on to pull-up drive the output node OUT. When the second bit TC<1> is at a high level, the transistor P2 may be turned off, and the transistor N2 may be turned on to pull-down drive the output node OUT.

The transistors N0 to N2 and P0 to P2 may have different drivabilities. At this time, the NMOS transistor N0 may have the largest drivability, the NMOS transistor N2 may have the smallest drivability, and the NMOS transistor N1 may have a drivability between the NMOS transistor N0 and the NMOS transistor N2. Further, the PMOS transistor P0 may have the largest drivability, the PMOS transistor P2 may have the smallest drivability, and the PMOS transistor P1 may have a drivability between the PMOS transistor P0 and the PMOS transistor P2. For reference, the reference numeral 'VDD' may represent a supply voltage.

The second duty-cycle adjusting unit 170 may have the same configuration as the first duty-cycle adjusting unit 150, and operate in the same manner as the first duty-cycle adjusting unit 150.

Figure 10:
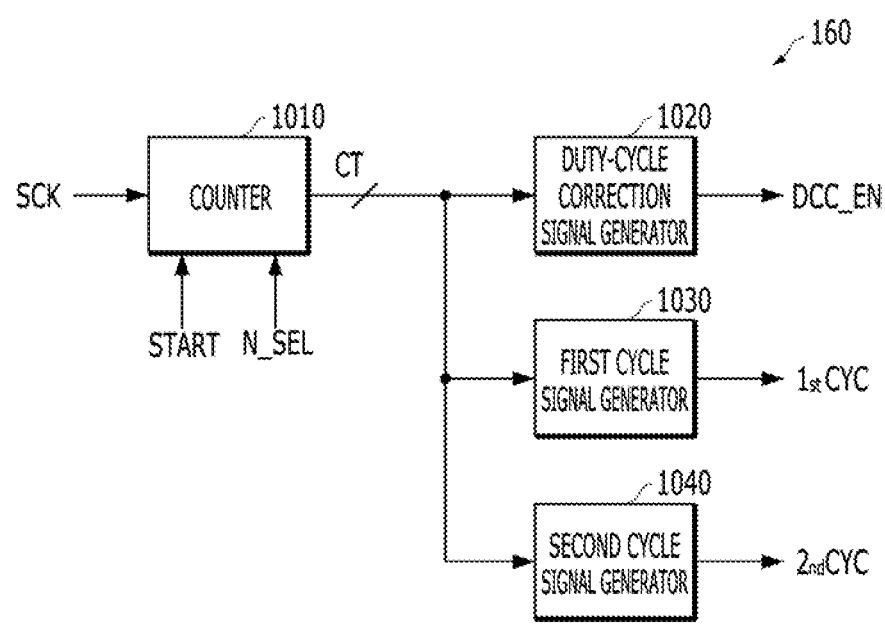
FIG. 10 is a block diagram illustrating an exemplary configuration of a control unit shown in FIG. 1.

FIG. 10 is a block diagram illustrating the control unit 160 of FIG. 1.

Referring to FIG. 10, the control unit 160 may include a counter 1010, a duty-cycle correction signal generator 1020, a first cycle signal generator 1030 and a second cycle signal generator 1040.

The counter 1010 may count the source clock SCK when the start signal START is activated, and generate counting information CT using the counting result. The counting information CT may include a multi-bit signal having a binary value corresponding to the counting result for the source clock SCK. The counter 1010 may reset the counting information CT when the unselect signal N_SEL is activated.

The duty-cycle correction signal generator 1020 may activate the duty-cycle correction signal DCC_EN when the counting information CT has a start value, and deactivate the duty-cycle correction signal DCC_EN when the counting information CT has an end value.

The first cycle signal generator 1030 may activate the first cycle signal 1stCYC when the counting information CT has a first start value, and deactivate the first cycle signal 1stCYC when the counting information CT has a first end value.

The second cycle signal generator 1040 may activate the second cycle signal 2ndCYC when the counting information CT has a second start value, and deactivate the second cycle signal 2ndCYC when the counting information CT has a second end value.

When the value of the counting information CT increases by 1 whenever the source clock SCK is counted once, the start value, the end value, the first start value, the first end value, the second start value and the second end value may have a relation of (start value≤first start value<first end value≤second start value<second end value≤end value). Therefore, an active period of the first cycle signal 1stCYC and an active period of the second cycle signal 2ndCYC may be included in an active period of the duty-cycle correction signal DCC_EN, and the active periods of the first cycle signal 1stCYC and the second cycle signal 2stCYC may be set not to overlap each other. The start value, the end value, the first start value, the first end value, the second start value and the second end value may differ depending on design, while satisfying the above-described condition.

Figure 11:
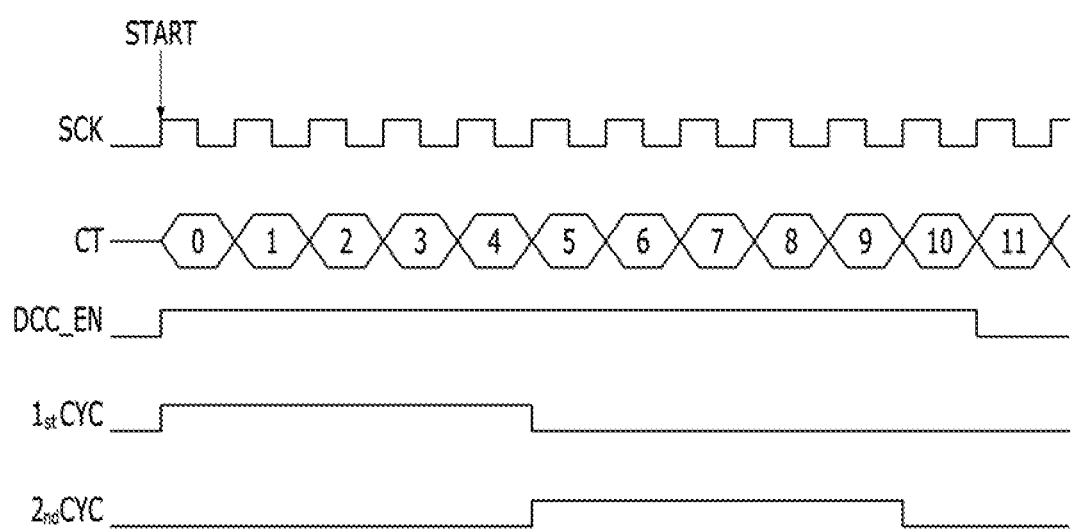
FIG. 11 is a waveform diagram describing an operation of the control unit shown in FIG. 10.

FIG. 11 is a waveform diagram describing an operation of the control unit 160 shown in FIG. 10.

FIG. 11 shows the case in which the duty-cycle correction signal DCC_EN is activated during 11 cycles of the source clock SCK, and each of the first cycle signal 1stCYC and the second cycle signal 2ndCYC is activated during five cycles of the source clock SCK. In the example of FIG. 11, the start value may be set to 0, the end value may be set to 11, the first start value may be set to 0, the first end value may be set to 5, the second start value may be set to 5, and the second end value may be set to 10.

The counting information CT may have a binary value corresponding to a decimal number shown in FIG. 11. For example, when the counting information CT is a multi-bit signal containing four bits, the counting information CT may have binary values of 0000 to 1111, which are expressed as decimal numbers of 0 to 15, respectively.

When the start signal START is activated, the counting information CT may be outputted, and the duty-cycle correction signal DCC_EN and the first cycle signal 1stCYC may be activated because the initial value of the counting information CT is 0. When the value of the counting information CT becomes five after five counting operations are performed, the first cycle signal 1stCYC may be deactivated, and the second cycle signal 2ndCYC may be activated. Then, when the value of the counting information CT becomes 10 after five counting operations are performed, the second cycle signal 2ndCYC may be deactivated. Finally, when the value of the counting information becomes 11 after one counting operation is performed, the duty-cycle correction signal DCC_EN may be deactivated.

FIG. 11 illustrates the case in which the unselect signal N_SEL is not activated. However, when the unselect signal N_SEL is activated because a delayed clock was not selected while the first cycle signal 1stCYC was activated, the counting information CT may be reset, and the duty-cycle correction signal DCC_EN, the first cycle signal 1stCYC and the second cycle signal 2ndCYC may be all deactivated.

The duty-cycle correction circuit 100 shown in FIG. 1 may perform a duty-cycle correction operation only during a predetermined period, directly detect the length of the high-level section or low-level section using the clock signals generated through the target clock, and generate a signal for duty-cycle correction. Thus, the duty-cycle correction circuit can perform duty-cycle correction through a relatively simple configuration, and minimize power consumption required for the duty-cycle correction.

Figure 12:
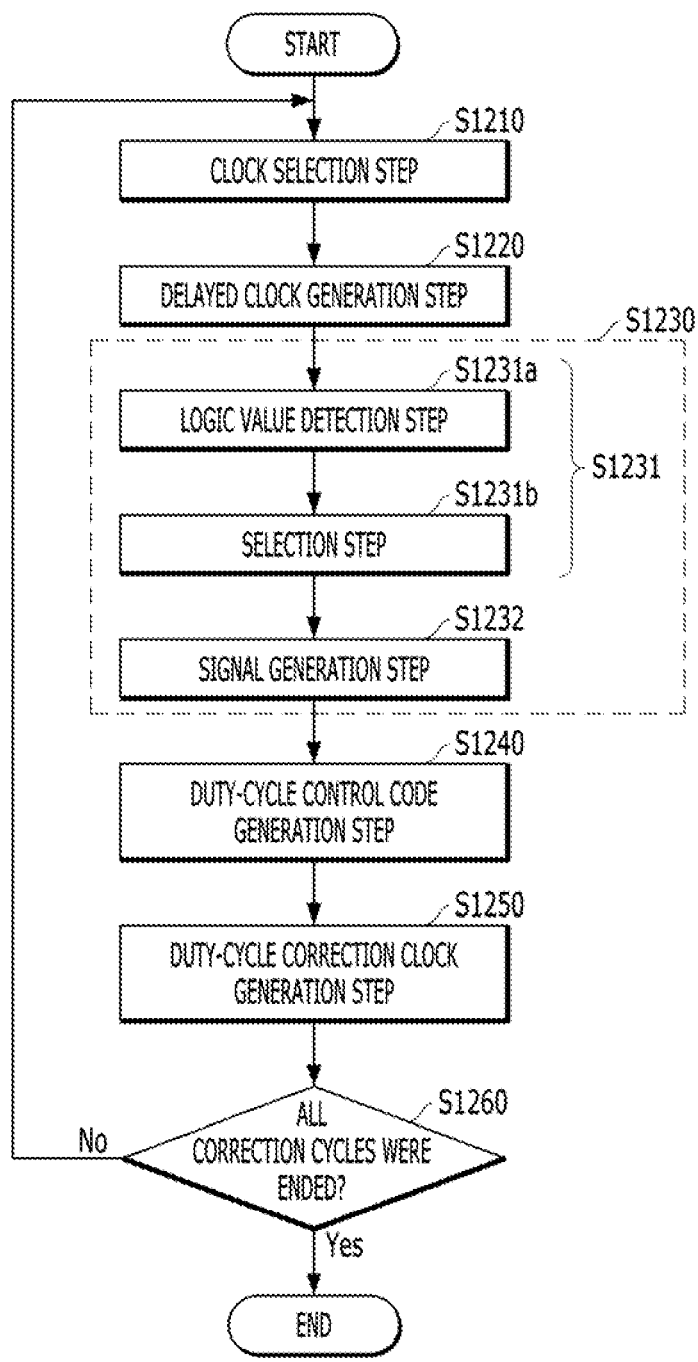
FIG. 12 is a flowchart of a duty-cycle correction method, in accordance with an embodiment of the present invention.

FIG. 12 is a flowchart describing a duty-cycle correction method in accordance with an embodiment of the present invention.

Referring to FIG. 12, the duty-cycle correction method may include a clock selection step S1210, a delayed clock generation step S1220, an up/down signal generation step S1230, a duty-cycle control code generation step S1240 and a duty-cycle correction clock generation step S1250.

The duty-cycle correction operation may be started with the clock selection step S1210 of selecting one of the source clock SCK and the duty-cycle correction clock DCK and outputting the target clock TCK. At this time, the source clock SCK may be selected as the target clock TCK at the first correction cycle, and the duty-cycle correction clock DCK may be selected as the target clock TCK at the subsequent correction cycles.

The delayed clock generation step S1220 may include generating the plurality of delayed clocks DEL_CK0 to DEL_CK7 by delaying the target clock TCK by different delay values.

The up/down signal generation step S1230 may include generating the up/down signal UP/DN according to the length of the second section of the target clock TCK and the length of the first section of a delayed clock having a delay value corresponding to the first section of the target clock TCK, among the plurality of delayed clocks DEL_CK0 to DEL_CK7.

At the up/down signal generation step S1230, when the length of the second section of the target clock TCK is shorter than the length of the first section of the delayed clock having the delay value corresponding to the first section of the target clock TCK, the up/down signal UP/DN to decrease the length of the first section of the duty-cycle correction clock DCK may be generated. Furthermore, when the length of the second section of the target clock TCK is longer than the length of the first section of the delayed clock having the delay value corresponding to the first section of the target clock TCK, the up/down signal UP/DN to increase the length of the first section of the duty-cycle correction clock DCK may be generated.

The up/down signal generation step S1230 may include a delayed clock selection step S1231 of selecting the delayed clock having the delay value corresponding to the first section of the target clock TCK, from the plurality of delayed clocks DEL_CK0 to DEL_CK7, and a signal generation step S1232 of generating the up/down signal UP/DN according to the selected delayed clock SDEL_CK and the delayed target clock DEL_TCK. The up/down signal UP/DN may be generated by performing an AND operation on the delayed target clock DEL_TCK and the selected delayed clock SDEL_CK.

The delayed clock selection step S1231 may include a logic value detection step S1231a of detecting the logic values of the target clock TCK at preset edges of the plurality of delayed clocks DEL_CK0 to DEL_CK7, and a selection step S1231b of selecting one delayed clock from the plurality of delayed clocks DEL_CK0 to DEL_CK7 according to a result obtained by combining all or part of the detected logic values DET0 to DET7 of the target clock TCK.

When the delayed clock is selected at the selection step S1231b, the duty-cycle correction method may proceed to the signal generation step S1232 to generate the up/down signal UP/DN. When no delayed clock is selected at the selection step S1231b, the duty-cycle correction operation may be ended, and the plurality of delayed clocks DEL_CK0 to DEL_CK7 may be deactivated.

At the signal generation step S1232, when the high-level section of the duty-cycle correction clock DCK needs to be increased, the up/down signal UP/DN may maintain a low level, and when the high-level section of the duty-cycle correction clock DCK needs to be decreased, the up/down signal UP/DN may become a high level. At the signal generation step S1232, when the low-level section of the delayed target clock DEL_TCK is longer than the high-level section of the selected delayed clock SDEL_CK, the up/down signal UP/DN may maintain a low level, and when the high-level section of the selected delayed clock SDEL_CK is longer than the low-level section of the delayed target clock DEL_TCK, the up/down signal UP/DN may become a high level.

The duty-cycle control code generation step S1240 may include deciding and storing the value of the first bit TC<0> in response to the up/down signal UP/DN at the first correction cycle, and deciding and storing the value of the second bit TC<1> in response to the up/down signal UP/DN at the second correction cycle. That is, the values of the plurality of bits contained in the duty-cycle control code TC<0:1> may be set in response to the up/down signal UP/DN at different correction cycles.

The duty-cycle correction clock generation step S1250 may include generating the duty-cycle correction clock DCK by adjusting the duty-cycle of the source clock SCK in response to the duty-cycle control code TC<0:1>.

The duty-cycle correction period and the correction cycle may be set according to a result obtained by counting the source clock SCK. When the correction cycle is ended, the control unit may determine whether all of the correction cycles were ended. When all of the correction cycles were ended ("YES" at step S1260), the duty-cycle correction period may be ended. When all of the correction cycles were not ended ("NO" at step S1260), the next correction cycle may be started with the clock selection step S1210.

In accordance with the present embodiment, the duty-cycle correction circuit and method can reduce the duty-cycle correction time and power consumption by performing the duty-cycle correction operation only during a preset period. Furthermore, the target clock and the delayed clock may be used to simply configure the duty-cycle correction circuit.

Although various embodiments have been described for illustrative purposes, it will be apparent to those skilled in the art that various changes and modifications may be made without departing from the spirit and scope of the invention as defined in the following claims.

What is claimed is:

1. A duty-cycle correction circuit comprising:
   a delayed clock generation unit suitable for generating a plurality of delayed clocks by delaying a target clock by different delay values;
   an up/down signal generation unit suitable for selecting a delayed clock having a delay value corresponding to a first section of the target clock, from the plurality of delayed clocks, and generating an up/down signal according to a length of a second section of the target clock and a length of a first section of the selected delayed clock;
   a duty-cycle control code generation unit suitable for generating a duty-cycle control code in response to the up/down signal;
   a duty-cycle adjusting unit suitable for generating a duty-cycle correction clock by adjusting the duty-cycle of a source clock according to the duty-cycle control code; and
   a control unit suitable for enabling the delayed clock generation unit during a duty-cycle correction period, and disabling the delayed clock generation unit during periods except for the duty-cycle correction period.

2. The duty-cycle correction circuit of claim 1, wherein the duty-cycle correction period comprises two or more correction cycles.

3. The duty-cycle correction circuit of claim 2, further comprising:
   a target clock selection unit suitable for selecting the source clock as the target clock at a first correction cycle among the correction cycles, and selecting the duty-cycle correction clock as the target clock at any of the remaining correction cycles after the first correction cycle.

4. The duty-cycle correction circuit of claim 2, wherein the up/down signal generation unit generates the up/down signal to decrease a length of a first section of the duty-cycle correction clock when the length of the second section of the target clock is shorter than the length of the first section of the selected delayed clock, and generates the up/down signal to increase the length of the first section of the duty-cycle correction clock when the length of the second section of the target clock is longer than the length of the first section of the selected delayed clock.

5. The duty-cycle correction circuit of claim 2, wherein the duty-cycle control code generation unit decides values of a plurality of bits included in the duty-cycle control code, respectively, in response to the up/down signals which are generated at different correction cycles among the correction cycles.

6. The duty-cycle correction circuit of claim 5, wherein the duty-cycle control code generation unit comprises:
   a plurality of storage units, each suitable for storing the up/down signal generated at the corresponding correction cycle among the correction cycles, as the corresponding bit among the plurality of bits.

7. The duty-cycle correction circuit of claim 1, wherein the duty-cycle adjusting unit generates the duty-cycle correction clock by performing pull-up driving and pull-down driving, using pull-up drivability and pull-down drivability which are decided according to the duty-cycle control code.

8. The duty-cycle correction circuit of claim 2, wherein the up/down signal generation unit comprises:
   a clock selection unit suitable for selecting the delayed clock having the delay value corresponding to the first section of the target clock, from the plurality of delayed clocks, and generating a delayed target clock by delaying the target clock; and
   a clock combination unit suitable for generating the up/down signal according to the selected delayed clock and the delayed target clock.

9. The duty-cycle correction circuit of claim 8, wherein the clock selection unit detects logic values of the target clock at preset edges of the plurality of delayed clocks, and selects a delayed clock according to a combination of all or part of the detected logic values, from the plurality of delayed clocks.

10. The duty-cycle correction circuit of claim 8, wherein the clock combination unit generates the up/down signal by performing an AND operation on the delayed target clock and the selected delayed clock.

11. The duty-cycle correction circuit of claim 2, wherein the control unit sets the duty-cycle correction period and the correction cycles according to a result obtained by counting the source clock.

12. The duty-cycle correction circuit of claim 1, wherein the control unit disables the duty-cycle adjusting unit when no delayed clock among the plurality of delayed clocks is selected by the up/down signal generation unit.

13. A duty-cycle correction method comprising:
selecting one of a source clock and a duty-cycle correction clock as a target clock;
generating a plurality of delayed clocks by delaying the target clock by different delay values;
selecting a delayed clock having a delay value corresponding to a first section of the target clock, from the plurality of delayed clock;
generating an up/down signal according to a length of a second section of the target clock and a length of a first section of the selected delayed clock;
generating a duty-cycle control code in response to the up/down signal; and
generating the duty-cycle correction clock by adjusting the duty-cycle of the source clock according to the duty-cycle control code.

14. The duty-cycle correction method of claim 13, further comprising:
counting the source clock;
setting a duty-cycle correction period and two or more correction cycles included in the duty-cycle correction period according to a counting result; and
controlling the plurality of delayed clocks to be activated only at the duty-cycle correction period.

15. The duty-cycle correction method of claim 14, wherein the selecting of one of the source clock and the duty-cycle correction clock as the target clock comprises:
selecting the source clock as the target clock at a first correction cycle among the correction cycles; and
selecting the duty-cycle correction clock as the target clock at the other correction cycles.

16. The duty-cycle correction method of claim 14, wherein the generating of the up/down signal comprises:
generating the up/down signal to decrease a length of a first section of the duty-cycle correction clock when the length of the second section of the target clock is shorter than the length of the first section of the selected delayed clock; and
generating the up/down signal to increase the length of the first section of the duty-cycle correction clock when the length of the second section of the target clock is longer than the length of the first section of the selected delayed clock.

17. The duty-cycle correction method of claim 14, wherein the generating of the duty-cycle control code comprises:
deciding values of a plurality of bits included in the duty-cycle control code, respectively, in response to the up/down signals which are generated at different correction cycles among the correction cycles.

18. The duty-cycle correction method of claim 14, wherein the generating of the up/down signal comprises:
delaying the target clock; and
performing an AND operation on the selected delayed clock and the delayed target clock.

19. The duty-cycle correction method of claim 14, wherein the selecting of the delayed clock comprises:
detecting logic values of the target clock at preset edges of the plurality of delayed clocks; and
selecting the delayed clock from the plurality of delayed clocks according to a value obtained by combining all or part of the detected logic values of the target clock.

20. The duty-cycle correction method of claim 19, wherein the selecting of the delayed clock further comprises:
deactivating the plurality of delayed clocks when no delayed clock among the plurality of delayed clocks is selected.

* * * * *